United States Patent [19]

Michalski

[11] Patent Number: 4,497,982
[45] Date of Patent: Feb. 5, 1985

[54] INPUT UNIT

[75] Inventor: Dieter Michalski, Berlin, Fed. Rep. of Germany

[73] Assignee: ITT Industries, Inc., New York, N.Y.

[21] Appl. No.: 85,607

[22] Filed: Oct. 17, 1979

[30] Foreign Application Priority Data

Oct. 13, 1978 [DE] Fed. Rep. of Germany ....... 2844575

[51] Int. Cl.³ ............................................. H01H 13/70
[52] U.S. Cl. ............................. 200/5 R; 200/DIG. 2; 200/159 B; 200/5 A; 340/365 R
[58] Field of Search ................ 200/5 A, 5 R, DIG. 2, 200/DIG. 1, 159 B, 314; 340/365 C

[56] References Cited

U.S. PATENT DOCUMENTS

| 3,705,424 | 12/1972 | Harvey, Jr. | 200/DIG. 2 X |
| 3,728,501 | 4/1973 | Larson et al. | 200/DIG. 2 X |
| 3,987,259 | 10/1976 | Larson | 200/5 A |
| 3,988,551 | 10/1976 | Larson | 200/5 A |
| 4,046,981 | 9/1977 | Johnson et al. | 200/5 A X |
| 4,074,088 | 2/1978 | Keough et al. | 200/5 A |
| 4,197,439 | 4/1980 | Mecklenburg | 200/159 B |

OTHER PUBLICATIONS

R. A. Johnson, *IBM Technical Disclosure Bulletin;* "Pushbutton Switch with No Moving Parts"; Apr. 1971, vol. 13, No. 11, p. 3551.

*Primary Examiner*—J. R. Scott
*Attorney, Agent, or Firm*—James B. Raden; William J. Michals

[57] ABSTRACT

Input unit for electronic equipment, consisting of a body of insulating material with finger guides in which sensor contacts and pushbutton switches are arranged. By moving the finger along the guides characters can be written and the sensor contacts produce corresponding electrical signals. By operating a corresponding pushbutton it is indicated that the writing-in operation is completed.

3 Claims, 6 Drawing Figures

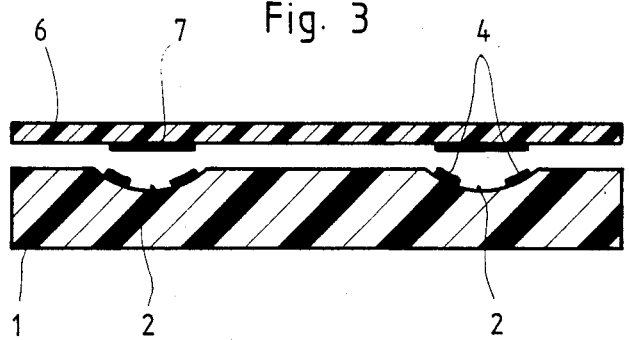
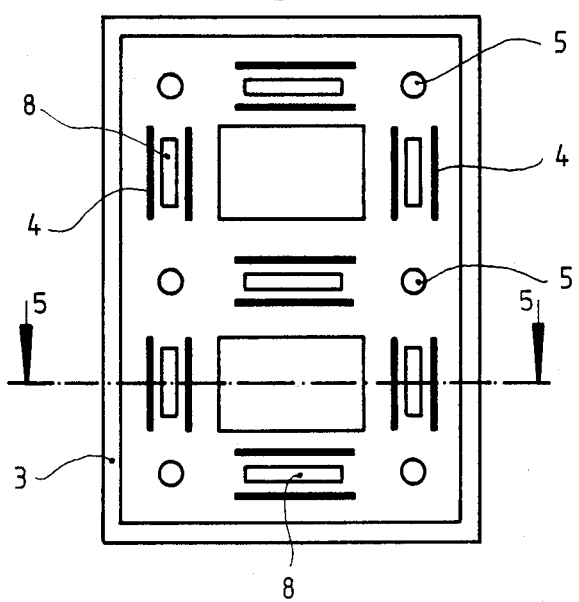
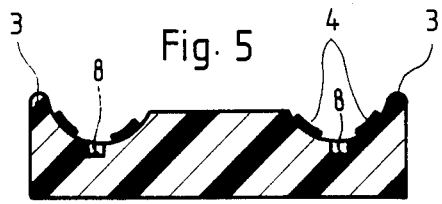

4,497,982

INPUT UNIT

BACKGROUND OF THE INVENTION

The invention relates to an input unit for electronic equipment, containing several sensor contacts which, when being swept over by a finger, produce electrical signals corresponding to the symbol as written with the finger.

Input units of this type are already known. Thus, in the technical journal "Elektronik 1977", No. 12, on page 128 there is described and shown an input unit in which several sensor areas are arranged in one plane next to each other and which, when being swept over by a finger, transmit corresponding signals to an electronic device. In so doing, the transmitted signals correspond to the symbol as written with the finger on the sensor contacts. In this conventional type of input device, however, it can easily happen that the corresponding symbol is not written exactly with the finger on the sensor areas, so that a sequence of signals will result which is either incapable of being read electronically, or does not correspond to the written-in symbol. Moreover, during the writing-in, the movement of the finger over the sensor contact areas must be checked visually.

It is the object of the invention, to provide an input unit of the type mentioned hereinbefore, in which faulty inputs are reliably avoided and which is capable of being operated also without visibility on to the sensor areas.

SUMMARY OF THE INVENTION

An input unit for translating human hand movements into electrical signals indicative of alpha-numeric symbols. A generally flat block of insulating material is provided. A plurality of guide grooves are provided on the upper surface of said block said grooves which are arranged in a pattern indicative of the segments of an alpha-numeric character. A plurality of contact elements respectively provided in each of said grooves and being responsive to physical contact stimulus provided by the human hand. Means are provided for coupling each of said contact elements to an external electrical circuit.

BRIEF DESCRIPTION OF THE DRAWING

Examples of embodiment of the invention will now be described in greater detail with reference to FIGS. 1 to 6 of the accompanying drawings, in which:

FIG. 3 is a sectional view taken through another type of embodiment of the invention, FIG. 4 is a top view on to a further type of embodiment of the invention, FIG. 5 is a sectional view of the unit taken along the line 5—5 of FIG. 4.

DETAILED DESCRIPTION

Figure 1:
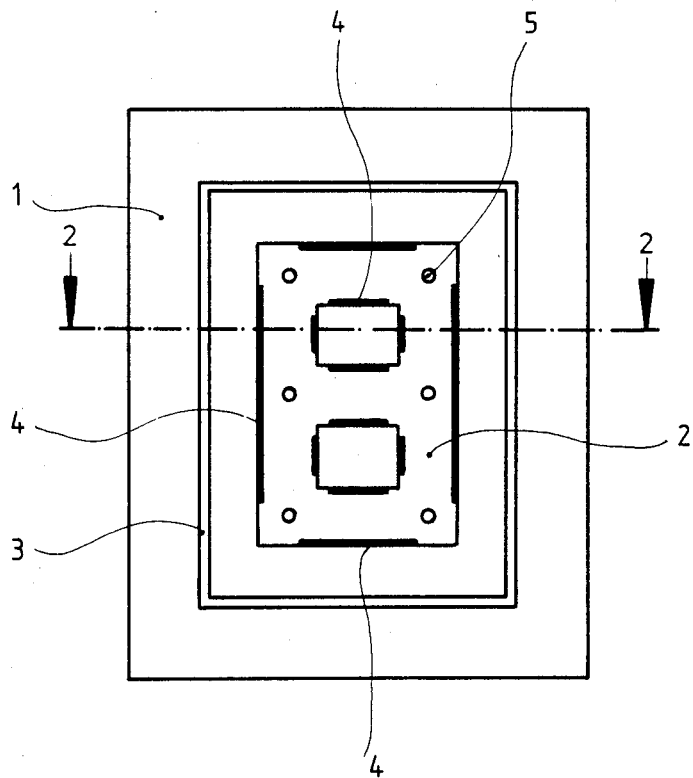
FIG. 1 is a top view on to an input unit according to the invention.
Figure 2:
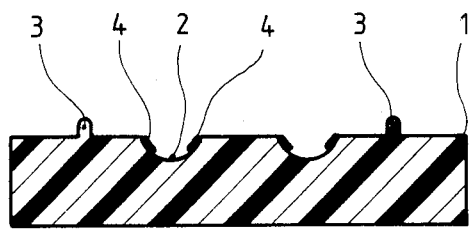
FIG. 2 is a sectional view of the unit taken along line 2—2 of FIG. 1.

The input unit as shown in FIG. 1 consists substantially of a body of insulating material 1 which is provided with suitable finger guides 2, and in which sensor contacts 4 are arranged along the finger guides 2. The finger guides 2 may be of any suitable type, but it is of advantage to design them to have the shape of channel-like grooves 2 extending in the body of insulating material 1. Moreover, it is appropriate for the finger guides to be of straight-lined design, and to give them the shape of a seven-segment display of the type known per se, and as shown in FIG. 1. The grooves 2 are provided with suitable sensor contacts 4, so that a switching process is triggered as soon as the contacts 4 are being swept over by a finger along the groove. For this purpose, any suitable types of sensor contacts may be arranged along the finger guide 2, such as capacitive contacts or else also finger-touch (sensor) contacts and, finally, it is also possible to use corresponding types of sensitive pushbutton switches of flat design. It is most simple, however, to arrange metal contacts 4 along the groove 2 forming the finger guide. In the type of embodiment shown in FIGS. 1 and 2, the sensor contacts 4 are arranged along the edge portion of the grooves 2, so that when a finger sweeps along the groove, the corresponding contacts will be closed. By passing along the grooves 2 with the finger, it is now possible to draw various symbols, such as the figures 0 to 9 or suitable characters, such as A, E, S and H. In cases where the input unit has the shape of a seven-segment display as is shown in FIGS. 1 and 2, all those symbols can be written in, which are also capable of being displayed on a seven-segment display. The invention, however, is in no way restricted to the use of a device having the shape of a seven-segment display; it may also have other shapes with the aid of which more complicated symbols may be written in. By passing along the grooves 2 with the finger, there are successively closed the corresponding sensor contacts 4 thus producing in the connected electronics a code word consisting of pulses corresponding to the written-in symbol. In this way, and without requiring any auxiliary means, an instruction may be fed into an electronic system, such as a calculator (computer) in order thus to trigger a predetermined process. Considering that the writing finger, by the finger guides, is reliably guided along the sensor contacts, a faulty input is practically impossible. Moreover, since the finger guides can also be easily made out by touch (feel), it is not necessary to look on the input unit while writing in. This is of particular importance in cases where the input operation has to be carried out under conditions in which the user's attention must be simultaneously directed to other proceedings. This, for example, is the case with input units intended to be used while driving (operating) a vehicle.

In cases where an input operation is to be carried out without visual contact with the input unit, (such as in the dark) it is moreover helpful for the input unit to be still provided with a boundary which can be easily made out by touch, as is shown in FIG. 1 and indicated by the reference numeral 3. Thus, without having to watch the input unit itself, it is first possible to make out the boundary of the unit by touch, whereupon the symbol is written with the finger into the input unit by sliding with the finger along the grooves.

According to the further embodiment of the invention, pushbutton switches 5 are arranged at the corner and junction points of the finger guides. These pushbutton switches serve to produce a signal for indicating that the writing-in of the symbol is finished. These switches, however, may also serve to signalize where and when the writing-in begins. The writing-in always ends at a predetermined corner or junction point at which, upon finishing of the writing-in, the corresponding switch is shortly actuated by being pressed by the finger. The switch may also be used in such a way that the written-in signals, by touching the sensor contacts, are at first stored, and that only upon depressing a switch 5, the complete stored information is transferred. Appropriately, the switches 5 are designed as flat snap-action switches, so that the snapping over of the switch, when actuated by the finger, is distinctly noticeable.

FIG. 3 is the sectional view of another type of embodiment of the invention. Here, two sensor contacts are arranged next to each other in the groove 2 provided for in the body of insulating material 1, with a foil of insulating material 6 being placed over the groove, and with the foil being provided with metal coatings 7 on its bottom side. On being pressed by the finger tip, this foil is in such a way elastically deformable that the metal coating 7 will bridge the two sensor contacts 4. If so required, and instead of the foil of insulating material 6, it is also possible to use a thin metal foil which then will not require any additional coating. Finally, it is also possible to provide the metal coating 7 on the lower side of the foil of insulating material 6, with a suitable terminal, and to arrange only one single sensor contact 4 in the groove 2.

In order to be able to reliably check the actuation of the sensor contacts, indicating means are provided for in accordance with a further embodiment of the invention, for indicating to the user the becoming effective of the sensor contacts. Preferably, these means consist of lamps which are arranged accordingly.

FIG. 4 is a top view on to one type of embodiment of the invention, in which lamps are arranged within the grooves. FIG. 5 is a sectional view taken along the line 5—5 of FIG. 4.

In the type of embodiment according to FIGS. 4 and 5, lamps 8 are shown to be arranged between the sensor contacts 4 in the grooves, so that the touching of the sensor contacts is followed by the lighting up of the corresponding lamp for indicating that a signal has been transmitted. Accordingly, when a symbol has been completely written into the input unit, it is distinctly recognizable as such by the lighting up of the corresponding lamps in the grooves. Of course, it is also possible to provide additional lamps for the switches 5.

In some cases it may be advisable not to arrange the corresponding lamps directly in the groove of the input unit. This may be of advantage, especially in cases where the input unit is so arranged as not to be directly in the field of observation of the operator. In these cases it may be of advantage to arrange the lamps separately from the input unit, i.e. in such a way that only the lamps are in the field of view of the operator. Then, of course, they are likewise in such a mutual arrangement as to correspond to the positions of the respective sensor contacts. The indicating device including the lamps, of course, may be designed substantially smaller than the input unit itself, in which the groove size has to depend on the width of the human finger.

On the other hand, however, it is also possible to make the input unit substantially smaller which, instead of with the finger, will have to be operated with a corresponding stylus (pin) to be guided along the groove.

Figure 6:
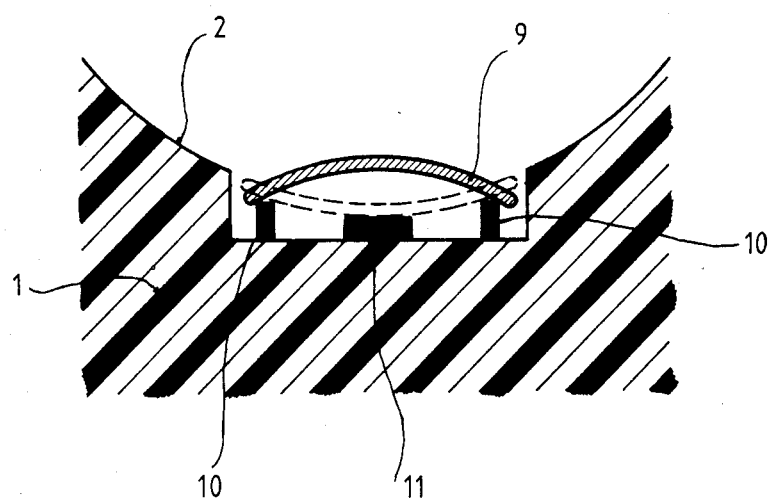
FIG. 6 is the sectional view of a type of embodiment relating to a switch used in the input unit according to the invention.

FIG. 6 is a sectional view taken through one possible type of embodiment relating to a switch 5. This switch substantially consists of a snap-action plate 9 resting on side contacts 10 designed e.g. as a contact ring. The centre contact 11 is touched upon bending through the snap-action plate, thus bridging the contacts 10 and 11. The outwardly curved spring plate 9 has a clearly noticeable snap-over effect, so that the actuation of the switch is felt distinctly by the operating finger.

What is claimed is:

1. An input unit for translating human hand movements into electrical signals indicative of alpha-numeric symbols comprising, in combination:
   a generally flat block of insulating material;
   a plurality of guide grooves in the upper surface of said block said grooves being arranged in a pattern indicative of the segments of an alpha-numeric character;
   a plurality of contact elements respectively provided in each of said grooves and being responsive to physical contact stimulus provided by the human hand; and
   means for coupling each of said contact elements to an external electrical circuit.

2. The input unit according to claim 1, further including at least one push button switch mounted in a given groove and being responsive to physical contact stimulus and being coupled to an external electrical circuit to indicate a predetermined point in the hand movement sequence corresponding to the alpha-numeric character.

3. The input unit according to claim 2, further including a plurality of lamp devices respectively provided in each of said grooves and being coupled to the corresponding contact element so that said lamp device is activated by said corresponding element in response to human hand stimulation.

* * * * *